US010021789B2

(12) United States Patent
Ochi et al.

(10) Patent No.: US 10,021,789 B2
(45) Date of Patent: Jul. 10, 2018

(54) METAL-LAMINATED POLYIMIDE SUBSTRATE, AND METHOD FOR PRODUCTION THEREOF

(75) Inventors: Shinya Ochi, Ehime (JP); Ryuichi Nakagami, Ehime (JP); Makoto Kohtoku, Kanagawa (JP); Mika Hamada, Kanagawa (JP)

(73) Assignee: EBARA-UDYLITE CO., LTD., Tokyo (JP)

( * ) Notice: Subject to any disclaimer, the term of this patent is extended or adjusted under 35 U.S.C. 154(b) by 708 days.

(21) Appl. No.: 12/666,872

(22) PCT Filed: Jun. 26, 2008

(86) PCT No.: PCT/JP2008/001677
§ 371 (c)(1),
(2), (4) Date: Dec. 28, 2009

(87) PCT Pub. No.: WO2009/004774
PCT Pub. Date: Jan. 8, 2009

(65) Prior Publication Data
US 2010/0189974 A1 Jul. 29, 2010

(30) Foreign Application Priority Data
Jul. 2, 2007 (JP) ................................. 2007-174504

(51) Int. Cl.
| *B32B 15/08* | (2006.01) |
| *C23C 18/22* | (2006.01) |
| *C23C 18/32* | (2006.01) |
| *H05K 3/38* | (2006.01) |
| *C23C 18/16* | (2006.01) |
| *C23C 18/20* | (2006.01) |
| *H05K 3/18* | (2006.01) |
| *B32B 15/20* | (2006.01) |
| *B32B 27/28* | (2006.01) |
| *C23C 18/30* | (2006.01) |
| *H05K 1/03* | (2006.01) |

(52) U.S. Cl.
CPC ............. *H05K 3/381* (2013.01); *B32B 15/08* (2013.01); *B32B 15/20* (2013.01); *B32B 27/281* (2013.01); *C23C 18/1653* (2013.01); *C23C 18/2086* (2013.01); *C23C 18/22* (2013.01); *C23C 18/32* (2013.01); *H05K 3/181* (2013.01); *B32B 2307/204* (2013.01); *B32B 2307/306* (2013.01); *B32B 2307/712* (2013.01); *B32B 2307/714* (2013.01); *B32B 2457/00* (2013.01); *C23C 18/30* (2013.01); *H05K 1/0346* (2013.01); *H05K 2201/0154* (2013.01); *H05K 2203/0793* (2013.01); *Y10T 428/2495* (2015.01); *Y10T 428/31681* (2015.04)

(58) Field of Classification Search
CPC ... B32B 15/08; B32B 15/20; B32B 2307/204; B32B 2307/306; B32B 2307/712; B32B 2307/714; B32B 2457/00; B32B 27/281; C23C 18/1653; C23C 18/2086; C23C 18/22; C23C 18/32; H05K 1/0346; H05K 2201/0154; H05K 2203/0793; H05K 3/181; H05K 3/381; Y10T 428/2495; Y10T 428/31681

See application file for complete search history.

(56) References Cited

U.S. PATENT DOCUMENTS

| | | | | |
|---|---|---|---|---|
| 3,937,857 | A | * | 2/1976 | Brummett et al. ............. 216/13 |
| 4,112,139 | A | * | 9/1978 | Shirk et al. ................... 430/315 |
| 4,832,799 | A | * | 5/1989 | Knudsen et al. ............. 205/167 |
| 5,441,770 | A | * | 8/1995 | Rychwalski et al. ......... 427/306 |
| 6,042,929 | A | | 3/2000 | Burke et al. |
| 6,045,713 | A | | 4/2000 | Tamiya et al. |
| 6,767,644 | B2 | * | 7/2004 | Aida ..................... C23C 14/022 427/307 |
| 6,875,519 | B2 | | 4/2005 | Saeki et al. |
| 7,241,490 | B2 | | 7/2007 | Aida |
| 2004/0018131 | A1 | | 1/2004 | Izumida et al. |
| 2006/0159854 | A1 | | 7/2006 | Yanagimoto et al. |

(Continued)

FOREIGN PATENT DOCUMENTS

| EP | 1 959 029 A1 | 8/2008 | |
|---|---|---|---|
| JP | 06032926 A | * 2/1994 | ................ C08J 7/12 |

(Continued)

OTHER PUBLICATIONS

Machine translation of JP 06032926 (2011).*

(Continued)

*Primary Examiner* — Callie Shosho
*Assistant Examiner* — John D Freeman
(74) *Attorney, Agent, or Firm* — Wenderoth, Lind & Ponack, L.L.P.

(57) ABSTRACT

An object is to provide a laminated polyimide substrate, and a method for the production thereof, in which various properties are ensured and/or provided by effectively controlling changes over time under stringent conditions, while ensuring sufficient adhesion between a polyimide film and metal layer. A laminated polyimide substrate comprises a polyimide layer, an alkali-treated layer derived from the polyimide layer, and a metal layer, arranged in that order, wherein the alkali-treated layer contains an anionic functional group, and is a laminated structure having a layer containing a metal catalyst arranged on the metal layer side and a layer containing a complex of the metal catalyst arranged on the polyimide layer side.

15 Claims, 5 Drawing Sheets

(56) References Cited

U.S. PATENT DOCUMENTS

| | | | | |
|---|---|---|---|---|
| 2007/0224346 A1* | 9/2007 | Wojtaszek | ................. | C08J 7/12 |
| | | | | 427/229 |
| 2007/0269680 A1* | 11/2007 | Kawamura | ............ | C23C 18/38 |
| | | | | 428/674 |
| 2009/0004465 A1 | 1/2009 | Kano et al. | | |
| 2010/0047458 A1* | 2/2010 | Kohtoku et al. | .............. | 427/304 |

FOREIGN PATENT DOCUMENTS

| | | |
|---|---|---|
| JP | 2002-256443 | 9/2002 |
| JP | 2006-188757 | 7/2006 |
| JP | 2006-193780 | 7/2006 |
| JP | 2007-77439 | 3/2007 |
| JP | 2007-119896 | 5/2007 |
| JP | 2007-165931 | 6/2007 |
| WO | 2007/066460 | 6/2007 |

OTHER PUBLICATIONS

Stephan Busato, Alberto Belloli, Paolo Ermanni, Inkjet printing of palladium catalyst patterns on polyimide film for electroless copper plating, Sensors and Actuators B: Chemical, vol. 123, Issue 2, May 21, 2007, pp. 840-846, ISSN 0925-4005, http://dx.doi.org/10.1016/j.snb.2006.10.031.*

International Search Report dated Oct. 7, 2008 in counterpart International Application No. PCT/JP2008/001677.

* cited by examiner

METAL-LAMINATED POLYIMIDE SUBSTRATE, AND METHOD FOR PRODUCTION THEREOF

TECHNICAL FIELD

The present invention relates to a metal-laminated polyimide substrate and method for the production thereof, and more particularly to a metal-laminated polyimide substrate having good adhesion between the metal and polyimide, as well as a method for the production thereof.

BACKGROUND ART

Flexible metal-laminated boards are used primarily as substrates for flexible printed wiring boards, and the recent trend toward smaller sizes, better portability, and higher density in electronic devices with printed wiring boards is growing, and this has been accompanied by increasing demand for finer pitch and higher dielectric properties in printed wiring boards. As a result, there has been more and more development of adhesive-free flexible metal-laminated boards having two-layered structures composed of a base and metal foil.

For example, techniques are available for producing laminated metal (e.g., copper) boards having a two-layered structure by a variety of methods, such as a method in which a thin metal layer is formed directly on a polyimide film by a metallizing process such as sputtering deposition or ion plating, and the metal foil is then thickened to the necessary thickness by electrolytic plating, or a method in which a polyimide resin is made into a varnish and allowed to adhere to metal foil by casting, lamination, or the like.

Even though metallizing methods allow ultra-thin metal foil to be easily formed and are suitable for producing a finer pitch, a problem is that production costs are greater because of the need for large vacuum sputtering equipment or the like.

Also, casting and laminating methods make use of an anchoring effect in the adhesion between metal foil and polyimide, and the surface of copper foil must therefore be rough. On the other hand, a problem is that such surface roughness leads to the deterioration of high dielectric properties and makes it impossible to sufficiently obtain the high frequency properties that are necessary in some printed wiring boards and the like. In addition, because existing metal foil is used, the metal foil thickness is limited, and as such is unsuitable for achieving a fine pitch.

To overcome such problems, a technique has been proposed, wherein a polymer layer, to which a polymer containing an electroless plated catalyst metal or precursor thereof has been directly chemically bonded, is laminated onto a polyimide film, and an electroless plating process is then carried out, so as to convert the polymer layer to an organic/inorganic hybrid layer and obtain a thin copper-clad polyimide film endowed with adhesive properties (such as Patent Citation 1).

Another method has also been proposed, wherein surface treatment of a polyimide film to form a surface roughness of 5 to 50 nm is followed by alkali treatment, the provision of metal ions, a reducing treatment, and plating (such as Patent Citation 2).

Patent Citation 1: Unexamined Patent Application 2006-193780
Patent Citation 2: Unexamined Patent Application 2002-256443

SUMMARY OF INVENTION

Technical Problem

However, some problems in terms of practical use and manufacturing are that the thin copper-clad polyimide film in Patent Citation 1 does not have satisfactory adhesive strength for practical purposes (0.5 N/mm) and does not meet JPCA specifications (JPCA-BM03: sputtering/plating copper peel strength of at least 0.35 N/mm, copper thickness 8 μm or more and less than 18 μm) with just the treatments noted above, and the film must be naturally dried for a long period of time (1 month) in order to bring about such adhesive strength. Another problem is that the peel strength may deteriorate during longer use, particularly during use at elevated temperatures such as when made into a printed wiring board.

Despite the attempt to ensure adhesion between the polyimide film and metal layer, and to reduce transmission loss in the plating method in Patent Citation 2, problems still remain in that adhesive strength for practical purposes cannot be sufficiently ensured, and the loss of adhesive strength during use at elevated temperatures in particular cannot be controlled sufficiently.

In view of the above problems, an object of the present invention is to provide a laminated polyimide substrate, and a method for the production thereof, in which various properties are ensured and/or provided by effectively controlling changes over time under stringent conditions, while ensuring sufficient adhesion between the polyimide film and metal layer.

Technical Solution

As a result of extensive research on the adhesion of metal foil in polyimide films, the present inventors found that, in order to ensure adhesion between polyimide film and metal foil, it is effective to thicken the adhesion-imparting layer such as the organic/inorganic hybrid film described above, but the thickness has a limit because that the adhesion between the polyimide film and metal foil tends to deteriorate as a result of changes over time at elevated temperatures; that the adhesion between the polyimide film and metal foil is affected by the distribution of components forming the so-called organic/inorganic hybrid layer comprising a blend of organic and inorganic components; and that, by controlling not only the distribution of metal atoms forming the metal layer but also the distribution of the catalyst metal itself, and complexes thereof, that form the metal film, the adhesion between the polyimide film and metal foil can be effectively increased more than expected, changes in adhesion over time can be controlled, and furthermore, such a distribution can be provided to ensure high dielectric properties and high frequency characteristics while achieving a finer pitch. The inventors perfected the present invention upon these findings.

The laminated polyimide substrate of the present invention is a laminated polyimide substrate comprising a polyimide layer, an alkali-treated layer derived from the polyimide layer, and a metal layer, arranged in that order, wherein the alkali-treated layer contains an anionic functional group, and is a laminated structure having a layer containing a metal catalyst arranged on the metal layer side and a layer containing a complex of the metal catalyst arranged on the polyimide layer side.

The metal layer in the laminated polyimide substrate is preferably a layer formed by electroless plating, or a laminated structure having a layer formed by electroless plating and a layer formed by electrolytic plating.

The electroless plating is also preferably electroless nickel phosphorous plating.

When the metal layer is a laminated structure having a layer formed by electroless plating and a layer formed by electrolytic plating, the peel strength between the metal layer and polyimide layer in particular is preferably at least 0.35 N/mm (more preferably at least 0.40 N/mm) before and after 168 hours of exposure in a 150° C. environment when the total thickness of the metal layer is 8 μm or more and less than 18 μm.

The layer containing a catalyst metal and the layer containing a complex of a catalyst metal are preferably present in a film thickness ratio of 1:7 to 7:1 in the alkali-treated layer.

The alkali-treated layer is preferably present in a thickness no more than 10% of the polyimide layer.

The anionic functional group is preferably a carboxyl group.

The catalyst metal is preferably at least one selected from the group consisting of palladium, platinum, silver, nickel, and copper.

The method for producing the laminated polyimide substrate of the present invention comprises the steps of:

subjecting a polyimide layer to surface treatment and forming an alkali-treated layer containing an anionic functional group derived from the polyimide layer, subjecting the alkali-treated layer to a catalyst metal-imparting treatment to introduce a complex of catalyst metal, subjecting the resulting alkali-treated layer containing the complex of a catalyst metal to a reducing treatment to form a laminated structure having a layer containing a metal catalyst on the surface side and a layer containing a complex of a metal catalyst on the polyimide layer side, and forming a metal layer on the surface of the polyimide layer.

The reducing treatment is preferably carried out using at least one reducing agent selected from the group consisting of $NaBH_4$, $KBH_4$, hydrazine, dimethylamine borane, and trimethylamine borane.

The layer containing a catalyst metal and the layer containing a complex of a catalyst metal are also preferably adjusted to a film thickness ratio of 1:7 to 7:1 in the reducing treatment.

Advantageous Effects

The present invention provides a laminated polyimide substrate capable of ensuring sufficient adhesion between the polyimide layer and metal layer in ordinary environments and periods of use, and can also provide stable adhesion between polyimide and metal layers without any loss of adhesion in long-term storage and/or use under stringent conditions.

Ensuring adhesion between the polyimide layer and metal layer also makes it possible to ensure the heat resistance margin during packaging and the weatherability margin, including the evolution of heat and the like, of a substrate for mounting components. Also, the ability to ensure the flatness of the laminated polyimide substrate itself results in high dielectric properties, and the ability to furthermore form an ultra-thin metal layer by electrolytic plating allows patterning to be controlled with a high degree of precision and allows micro-wiring patterns to be formed.

It is furthermore possible to produce a better laminated polyimide substrate that is stable and highly reliable by means of a simple and inexpensive method without the need for special equipment or special manufacturing processes.

The simple process described above furthermore enables reel-to-reel production of laminated polyimide substrates, can reduce production costs, and can increase production efficiency.

DETAILED DESCRIPTION OF THE INVENTION

Figure 1:
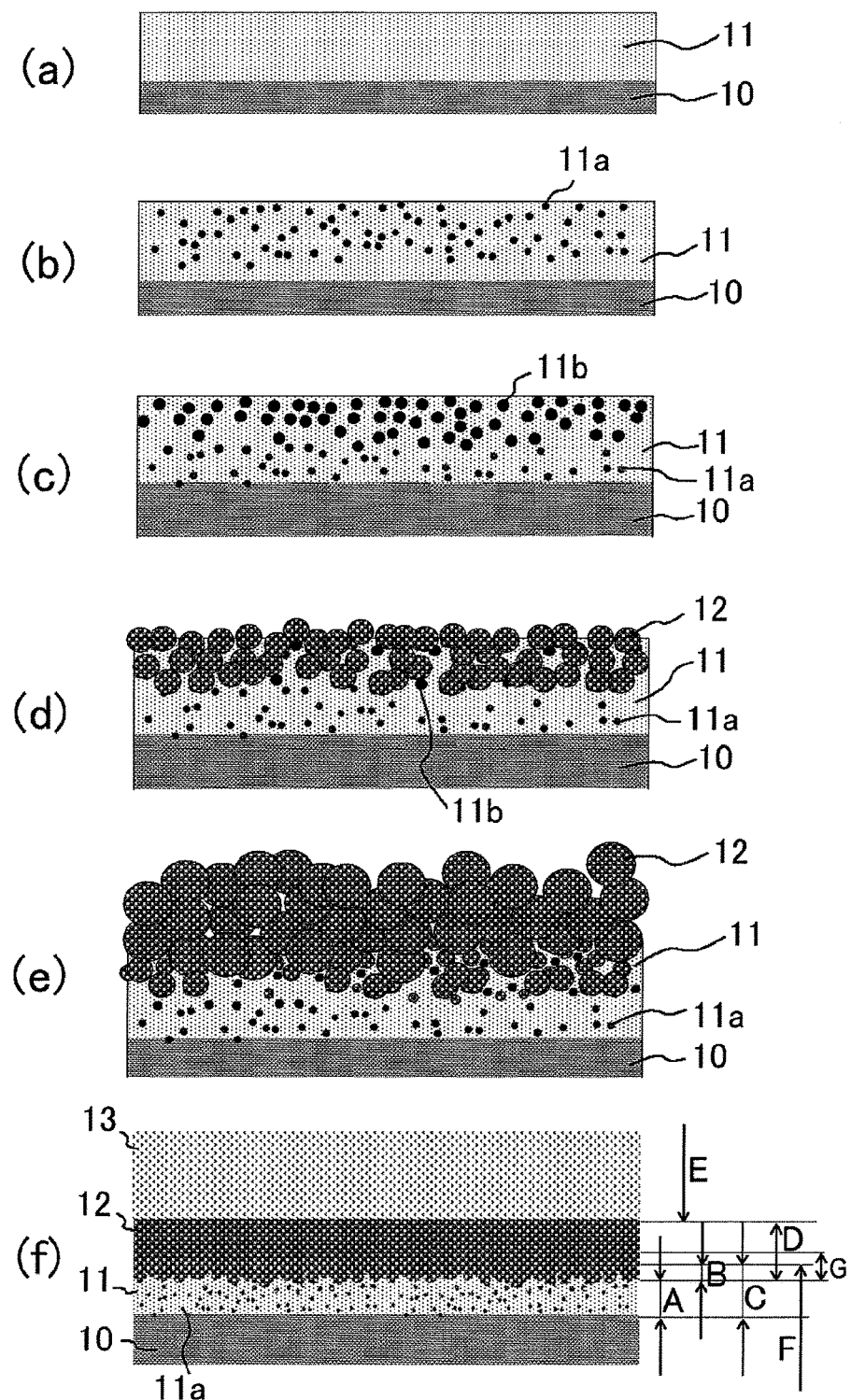
FIG. 1 is a schematic cross sectional diagram of the laminated polyimide substrate of the present invention.

The laminated polyimide substrate of the present invention is composed primarily of a polyimide layer, alkali-treated layer, and metal layer, laminated in that order.

The polyimide layer may be any that is ordinarily used as the substrate of a flexible board; examples include those composed of well-known polyimide resins and those containing well-known polyimide resins. Examples of polyimide resins include aromatic polyimides, polybiphenyl imides, polyketone imides, and polypyromellitic acid imides. These can be used in the form of monolayer films or multilayer films having at least one of one or more kinds of layers including at least one layer.

The thickness of the polyimide layer is not particularly limited, and may be about 0.5 μm to 1 mm, and preferably about 1 μm to 100 μm, for example.

The surface of the polyimide layer is preferably flat. For example, the surface roughness may be 100 nm or less, and preferably no more than about 10 nm or even more preferably no more than about 5 nm. That is because it will be possible to further reduce electrical loss during high frequency transmission and to ensure the flatness of the resulting substrate. The surface roughness can also be measured, for example, as Ra (arithmetic mean roughness) or Rz (10-point mean roughness) in accordance or compliance with JIS B0601 (1994). Of these, the effects noted above can be brought out particularly well when the Ra is less than 5 nm and the Rz is no more than 10 nm.

The alkali-treated layer is a layer that is derived from the polyamide layer and that contains an anionic functional group (see C in FIG. 1(f)). It is therefore different from a layer that is formed by separately laminating another polymer layer on a polyimide layer. Because it is thus a layer derived from the polyimide layer, it is possible to ensure firm adhesion, in the form of substantially part of the polyimide layer, on the surface of the polyimide layer prior to the formation of the alkali-treated layer (see F in FIG. 1(f)).

The anionic functional group is not particularly limited, and examples include one or a combination of two or more of carboxyl groups and sulfone groups, etc. Of these, carboxyl groups which are anionic functional groups derived from the polyimide layer are preferably included.

The alkali-treated layer is also composed of a laminated structure having a layer containing a catalyst metal on the surface side (see B in FIG. 1(f)) and a layer containing a complex of a catalyst metal on the polyimide layer side (see A in FIG. 1(f)). Here, examples of catalyst metals include, but are not particularly limited to, 0 valent metals, that is, iron group metals and platinum group metals. Specific examples include Pd, Ag, Cu, Ni, Al, Fe, and Co. Of these, Pd is preferred in consideration of its performance as a catalyst metal. Catalyst metal complexes are molecules or ions of coordination compounds in which the central atom is composed of a catalyst metal element. As used in the present Specification, the term "complex of catalyst metal" is used in the sense encompassing ions of the catalyst metal itself.

In another respect, the alkali-treated layer forms a so-called organic/inorganic hybrid layer comprising a blend of organic and inorganic components (see C in FIG. 1), on the surface side of which is arranged a layer wherein, in addition to the organic component, there predominates a mixture of a catalyst metal element in a reduced state activated as the catalyst, that is, a catalyst in a metallic state and the element forming the metal layer, and there is substantially no (or trace amounts, if present) catalyst metal element in a state that is not activated as catalyst, that is, catalyst metal element in the form of a complex or ions (see B in FIG. 1). That is, as used in the present Specification, "layer containing a metal catalyst" means a layer in which catalyst in a metallic state predominates over catalyst metal in a state not activated as catalyst. Here, predominant means more of one component is present than another component, in terms of the percent of number of atoms (atomic percent), and this can be verified by XPS analysis.

Meanwhile, arranged on the polyimide layer side is a layer wherein there predominates a catalyst metal in a state not activated as the catalyst, that is, the element of the catalyst metal in the form of a complex or ions, and there is substantially no (or trace amounts, if present) element forming the metal layer and/or catalyst metal in a metallic state (see A in FIG. 1).

That is, as used in the present Specification, "layer containing a complex of a metal catalyst" means a layer in which catalyst metal in a state not activated as catalyst predominates over catalyst in a metallic state.

Because the alkali-treated layer is thus formed with a two-layer structure in which elements/components are thus distributed, the layer arranged on the polyimide layer side interacts with both polyimide and catalyst metal to ensure firm adhesion between the two.

The layer containing the catalyst metal can be recognized by observation of cross sectional electron diffraction patterns of the laminated polyimide substrate, transmission electron microscopy (TEM), scanning transmission electron microscopy (STEM), scanning electron microscopy (SEM) and X-ray photoelectron spectroscopy (XPS), Auger electron spectroscopy (AES), or the like. The layer containing the complex of catalyst metal can also be detected by X-ray photoelectron spectroscopy (XPS).

The alkali-treated layer may be formed with a thickness of about 10% or less, preferably about 5 to 0.01%, and more preferably 1 to 0.01%, of the polyimide layer prior to the formation of the alkali-treated layer. In another respect, for example, the thickness may be about 100 nm or less, preferably about 5 to 80 nm, more preferably about 5 to 60 nm, and still more preferably about 5 to 40 nm.

In consideration of the adhesion between the polyimide layer and metal layer, the layer containing the catalyst metal and the layer containing the complex of catalyst metal may be present in a film thickness ratio of about 1:7 to 7:1, preferably about 1:4 to 4:1, and more preferably about 1:2 to 2:1.

The thickness of the layer containing the catalyst metal may therefore be about 30 nm or less, preferably about 1 to 20 nm, and more preferably about 5 to 15 nm. The thickness of the layer containing the complex of catalyst metal may therefore be about 30 nm or less, preferably about 1 to 30 nm, and more preferably about 5 to 15 nm. By satisfying such a range, it will be possible to further enhance the adhesion between the polyimide layer and metal layer by adjusting not only the metal element forming the metal layer but also the complex of catalyst metal for forming the metal layer to the desired distribution when forming the metal layer in later steps. Additionally, in the case of the thickness of the alkali-treated layer, a corresponding level of moisture may be produced from the surface which has been modified as a result of exposure to elevated temperature, but within the range of thickness for each layer as noted above, the production of moisture can be effectively controlled and the deterioration of peel strength can be prevented.

The metal layer may be a layer formed with various metals. Of these, the use of a metal which can be formed into a film by plating is preferred. Specific examples include chromium, copper, nickel, zinc, rhodium, palladium, silver, tin, platinum, and gold. Nickel, gold, silver, and copper are preferred in view of the conductivity of the laminated polyimide substrate.

The metal layer may be a single layer of the above metals or alloy thereof, and may also be a laminated layer. Examples include laminated layers of two or more layers, comprising a metal layer, on the alkali-treated layer side, that tends to interact or react with the catalyst metal contained in the alkali-treated layer, and a metal layer of good conductivity on the surface side. In another respect, examples include laminated layers of two or more layers, comprising a metal formed by electroless plating on the alkali-treated layer side (see D in FIG. 1(f)) and a metal layer formed by electrolytic plating on the surface side (see E in FIG. 1(f)).

Here, the electroless plating is preferably electroless nickel-phosphorus plating, for example. Seed layers formed by electroless nickel-phosphorus plating have excellent etching properties, and can therefore enable practical pattern formation with just a single ferric chloride solution etching, for example, and can allow etching costs to be reduced in subsequent steps. In such cases, an electroless nickel layer is preferably composed of a phosphorus-rich layer formed on the alkali-treated layer side (see G in FIG. 1(f)) and a non-phosphorus-rich layer on the surface side (or electrolytic plating-formed metal layer side). The phosphorus-rich layer and non-phosphorus-rich layer can be distinguished from each other by the relative concentrations of phosphorus which the layers contain. The ratio between the phosphorus concentrations of the phosphorus-rich layer and non-phosphorus-rich layer is preferably 10:5 to 10:8, as determined by Auger electron microscopy. The thickness ratio between the phosphorus-rich layer and non-phosphorus-rich layer is preferably 1:9 to 9:1.

Producing such a laminated structure allows the metal layer on the alkali-treated layer side (see D in FIG. 1(f)) to prevent (barrier effect) the metal layer formed by electrolytic plating (see E in FIG. 1(f)) from diffusing into the polyimide, and can prevent the peel strength of the metal layer from deteriorating when allowed to stand at elevated temperature in particular.

A laminated polyimide substrate having this kind of structure has a peel strength of at least 0.35 N/mm, preferably at least 0.4 N/mm, and more preferably at least 0.6 N/mm after the formation of the metal layer. The "peel strength after the formation of the metal layer" can be regarded as the value determined at the usual temperatures prevailing during storage, transport, and final use, such as a temperature of about 5 to 30° C., and the usual period of time during which they occur, such as a period of within about 180 days after the manufacture of the laminated polyimide substrate. The metal layer in such cases may be either the single layer or laminated layer noted above. The total thickness of the metal layer in such cases is not particularly limited, and may be about 8 to 18 μm, for example. The peel strength between the polyimide layer and metal layer can be determined in accordance with JIS C 6471 8.1. That is, the metal layer of the resulting laminated polyimide substrate is etched to a width of 3 mm, the metal layer is peeled off at a pulling speed of 50 mm/min and a pulling angle of 90° using a tensile strength tester (such as Test Stand Model-1310DW and Force Analyzer Explorer II (both by Aikoh Engineering Co., Ltd.)), and the peeling force at that time can be measured as the peel strength.

The peel strength is maintained at 0.35 N/mm or above after 168 hours of exposure in a 150° C. environment (0% humidity at atmospheric pressure).

The laminated polyimide substrate of the present invention can also be used as such, but the metal layer may be patterned (by a subtractive method or semi-additive method, for example) into a configuration to be used such as a wiring layer, and the alkali-treated layer or the like may be patterned (such as by a full adaptive method, or the like) into a configuration to be used such as a wiring layer. An alkali-treated layer and metal layer may be formed on both sides of the polyimide layer, or a through hole may be formed in the polyimide layer, and the alkali-treated layer, metal layer, or the like may be formed inside the through hole.

The laminated polyimide substrate of the present invention can be substantially produced by forming an alkali-treated layer on the polyimide layer, subjecting the alkali-treated layer to a catalyst metal-imparting treatment, reducing the alkali-treated layer, and forming a metal layer on the surface of the polyimide layer.

First, as shown in FIG. 1(a), an alkali-treated layer 11 is formed on a polyimide layer 10.

The alkali-treated layer can be formed using a suitable alkali solution. The alkali solution at this time may be any capable of opening the imide ring forming the polyimide.

An aqueous solution of an alkali substance such as lithium hydroxide, sodium hydroxide, or potassium hydroxide is suitable as such an alkali solution. The treatment in this case is carried out by immersing the polyimide layer for about 10 seconds to 50 minutes in an alkali solution having a concentration of about 0.01 to 10 mol/L at a temperature ranging from about 20 to 100° C. As a result, the imide rings of the polyimide layer are opened by means of hydrolysis, resulting in polyamic acid ions, and carboxyl groups are produced.

A well-known sulfonation step such as heating along with concentrated sulfuric acid may be used to introduce other anionic functional groups.

As shown in FIG. 1(b), the resulting alkali-treated layer 11 is subjected to a catalyst metal-imparting treatment. The catalyst metal-imparting treatment can be carried out by, for example, using a solution containing a catalyst metal.

The solution at this time may be a solution containing the catalyst metals noted above. Examples include solutions containing a catalyst metal or complex of a catalyst metal in the form of a metal salt or ions, and solutions in which they are dissolved in a suitable solvent and separated into metal ions and bases (anions). Specific examples include solutions of inorganic acid salts such as nitrates, hydrochlorides, sulfates, and phosphates of catalyst metals or their complexes.

Examples also include solutions of a complex of catalyst metal in which an amino group of a basic amino acid and a carboxyl group are coordinated adjacent to palladium, specifically, the palladium complex (trans form) represented by Formula (I)

[Chemical Formula 1]

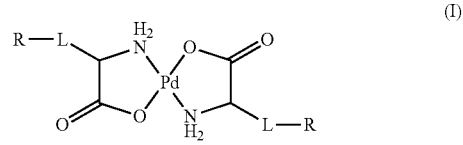

(I)

(where L is an alkylene group, and R is an amino group or guanidyl group), an isomer of this structure (cis form), or a mixture of them.

Examples of the alkylene group in Formula (I) include those with about 1 to 20 or about 1 to 10 carbon atoms, specifically, propylene, n-butylene, or t-butylene, etc.

Examples of the amino group or guanidyl group of R include those derived from a basic amino acid, for example, a cationic group such as lysine, arginine, or ornithine (amino group, guanidyl group). Specific examples include amino groups or guanidyl groups derived from L-lysine, D-lysine, DL-lysine, L-lysine hydrochloride, D-lysine hydrochloride, DL-lysine hydrochloride, L-lysine hydrochloride, D-lysine hydrobromide, DL-lysine hydrobromide, L-arginine, D-arginine, DL-arginine, L-arginine hydrochloride, D-arginine hydrochloride, DL-arginine hydrochloride, L-arginine hydrobromide, D-arginine hydrobromide, DL-arginine hydrobromide, L-ornithine, D-ornithine, DL-ornithine, L-ornithine hydrochloride, D-ornithine hydrochloride, DL-ornithine hydrochloride, L-ornithine hydrobromide, D-ornithine hydrobromide, and DL-ornithine hydrobromide.

The palladium complex can be produced by mixing and dissolving a palladium salt solution (such as palladium chloride, palladium sulfate, or palladium nitrate) and a basic amino acid aqueous solution in a molar ratio of about 1:2 at a temperature in the range of about 20 to 100° C., and adjusting the pH to about 4 to 7.5. This kind of complex may also be purified and concentrated or the like as desired by methods that are well known in the field.

The concentration of the catalyst metal solution is, for example, about 0.01 to 50 wt %, and preferably about 0.1 to 30 wt %.

Particularly in the case of a solution of the palladium complex noted above, the concentration, as determined based on metallic palladium, may range from 0.5 mg/L to the palladium complex saturated concentration, and preferably about 1 mg/L to 1000 mg/L.

The pH of the solution may be about 3 to 9, and preferably about 4 to 8, depending on the type of inorganic acid or basic amino acid that is used.

The polyimide layer including the alkali-treated layer may be immersed in such a solution, or the solution may be evenly sprayed or applied, etc., on the alkali-treated layer.

The catalyst metal-imparting treatment is carried out, for example, at a temperature in the range of about 20 to 100° C. for about 1 second to 10 hours, and preferably about several tens of seconds to several tens of minutes.

This treatment allows cationic groups in the catalyst metal itself or catalyst metal complex to interact with anionic functional groups in the alkali-treated layer of the polyimide layer, so that a catalyst metal complex $11a$ is introduced into the alkali-treated layer $11$, as shown in FIG. $1(b)$.

The depth to which the catalyst metal complex is introduced in the thicknesswise direction at this time can be controlled by adjusting as desired the type of catalyst metal, solvent used, solution temperature, treatment method, retention time, and the like.

As shown in FIG. $1(c)$, the alkali-treated layer $11$ into which the catalyst metal complex has been introduced is subjected to a reducing treatment. As a result of the reducing treatment, the catalyst metal complex $11a$ in the alkali-treated layer $11$ to which the catalyst metal complex has been introduced is reduced and converted to catalyst metal $11b$, and the action results in the formation of a laminated structure having a layer containing a catalyst metal complex on the polyimide layer side and a layer containing catalyst metal on the metal layer side.

The reducing treatment can be carried out by immersing the alkali-treated layer in a solution containing a reducing agent, or by spraying or applying the solution. Examples of reducing agents include metal ion reducing agents such as $NaBH_4$, hydrazine, DMAB (dimethylamine borane), trimethylamine borane (TMAB), and $KBH_4$. When a reducing agent solution is used, a solution with a concentration of 0.005 to 0.1 mol/L, and furthermore about 0.01 to 0.05 mol/L, may be appropriately used. The solution temperature is about 20 to 70° C., and preferably about 40 to 50° C. The reaction time is about 1 to 10 min, and preferably about 4 to 6 min. Hydrogen gas may also be sprayed, or the like.

The depth in the thicknesswise direction to which the metal catalyst complex is converted to catalyst metal in the alkali-treated layer containing the catalyst metal complex can be controlled by adjusting the type and concentration of the reducing agent, the application method, the temperature, the reaction time, and the like. That is, these can be adjusted so as to adjust the proportion of thickness between the layer containing the catalyst metal and the layer containing the catalyst metal complex.

A metal layer is then formed on the surface of the polyimide layer. The metal layer can be formed by utilizing the catalyst metal action and using a solution containing ions of the metal which constitutes the metal layer that is to be formed, so as to bring about the precipitation of metal ions and gradually form the layer of metal $12$ by a chemical reaction, as shown in FIG. $1(d)$ and (e), for example.

Specifically, this is the method usually referred to as electroless plating. Methods for immersing the polyimide layer in an electroless plating bath are available. The electroless plating bath used here can be one commonly known in the field of plating. Examples of common electroless plating bath compositions include those primarily containing the metal ions forming the metal layer to be obtained, a reducing agent, and additives such as stabilizers and complexing agents.

The reducing agent can be selected as desired depending on the metal ions that are used. Examples include HCOH, sodium hypophosphite, $H_2NNH_2$, and DMAB (dimethylamine borane). The additives are not particularly limited. Examples include chelators such as EDTA and Rochelle salts, and sodium malonate, sodium malate, and sodium succinate.

The time of immersion in the plating bath is, for example, preferably about 1 minute to 6 hours, and more preferably about 1 minute to 3 hours.

The metal layer thickness can be controlled depending on the plating bath metal salts, metal ion concentration, immersion time in the plating bath, plating bath temperature, and the like. In consideration of conductivity, the thickness may be at least 0.05 μm, and preferably about 0.05 to 3 μm.

As shown in FIG. $1(f)$, the metal layer of the laminated polyimide substrate in the present invention may also be a laminated structure having a metal layer formed by the electroless plating noted above (see D in FIG. $1(f)$) and a metal layer formed thereon by electrolytic plating (see E in FIG. $1(f)$). In the case of this type of laminated structure, an intermetallic compound layer may be formed between the electroless plated metal layer and the electrolytic plated metal layer to further enhance the bonding strength of the two.

The electrolytic plating can be carried out by applying methods and conditions generally known in the field of plating using the electroless plated metal layer as an electrode formed as described above. The thickness of the metal layer obtained by electrolytic plating can be set as desired according to the intended application of the laminated polyimide substrate that is obtained, and can be controlled by adjusting the type of metal included in the plating bath, the metal concentration, the immersion time, the current density, and the like.

Specifically, when used for common electrical wiring or the like, the thickness may be at least 0.5 μm, and preferably at least 3 μm, in the interests of conductivity.

In the method for producing the laminated polyimide substrate of the present invention, various processes such as a treatment for controlling surface roughness, surface degreasing treatment, solvent washing or water washing, corrosion resistance treatment, or drying are preferably carried out as desired any number of times at any time before or after the steps described above.

Specific examples include carrying out a treatment for controlling surface roughness and a degreasing treatment before the formation of the alkali-treated layer, carrying out solvent washing or water washing before and after the formation of the alkali-treated layer, before and after the catalyst metal-imparting treatment, before and after the reducing treatment, and before and after the formation of the metal layer, and carrying out a corrosion resistance treatment and drying after the formation of the metal layer (such as electrolytic plating).

A treatment for controlling surface roughness can be carried out, before or at the same time that the alkali-treated layer is formed on the polyimide layer, by employing a physical roughening treatment such as a sandblasting method, corona discharge treatment, or low-temperature plasma treatment, a chemical roughening treatment such as an alkali solution treatment, or a combination thereof.

A degreasing treatment can be carried out by a commonly employed method in the field using, for example, a polar solvent, an alkali solution, and/or a solution containing surfactants, etc., and solvent washing or rinsing can be carried out using an acid or alkali solution, water, or the like.

The corrosion resistance treatment is not particularly limited and can be carried out by a well-known method such as the adsorption of, for example, a rust inhibitor, specifically an antioxidant (such as benzotriazole or benzene azimide), to the surface of the metal layer.

Drying may be done by any method such as natural drying, heated drying, reduced pressure drying, vacuum heat drying, and air blown drying, but in consideration of the deterioration of the substrate itself, drying is preferably done at ambient temperature or a temperature thereabout.

Examples of the laminated polyimide substrate of the present invention and the production thereof are illustrated in detail below.

EXAMPLE 1

Kapton 100EN (film thickness 25 μm) by Toray/DuPont was used as the polyimide film. The polyimide film was subjected to a degreasing treatment with PB-120 (by Ebara-Udylite Co., Ltd.), it was then immersed for 2 min in a 0.5 mol/L potassium hydroxide aqueous solution (prepared using guaranteed reagent by Wako Pure Chemical Industries, Ltd.) at 50° C., and the surface was subjected to an alkali treatment.

0.21 g palladium chloride (guaranteed reagent, by Toyo Chemical Industrial Co., Ltd.) and 0.52 g L-lysine hydrochloride (guaranteed reagent, by Wako Pure Chemical Industries, Ltd.) were then added to 500 mL pure water, the pH was adjusted to 6.0 with potassium hydroxide (guaranteed reagent, by Wako Pure Chemical Industries, Ltd.), the solution was stirred for 1 hour at 70° C. to prepare a catalyst-imparting treatment solution with a concentration of 250 mg/L, as determined based on metallic palladium, and the resulting polyimide film was immersed for 5 minutes at 50° C.

The resulting polyimide film was immersed for about 2 minutes in a reducing treatment solution PC-66H (by Ebara-Udylite Co., Ltd.) at 35° C.

Figure 6:
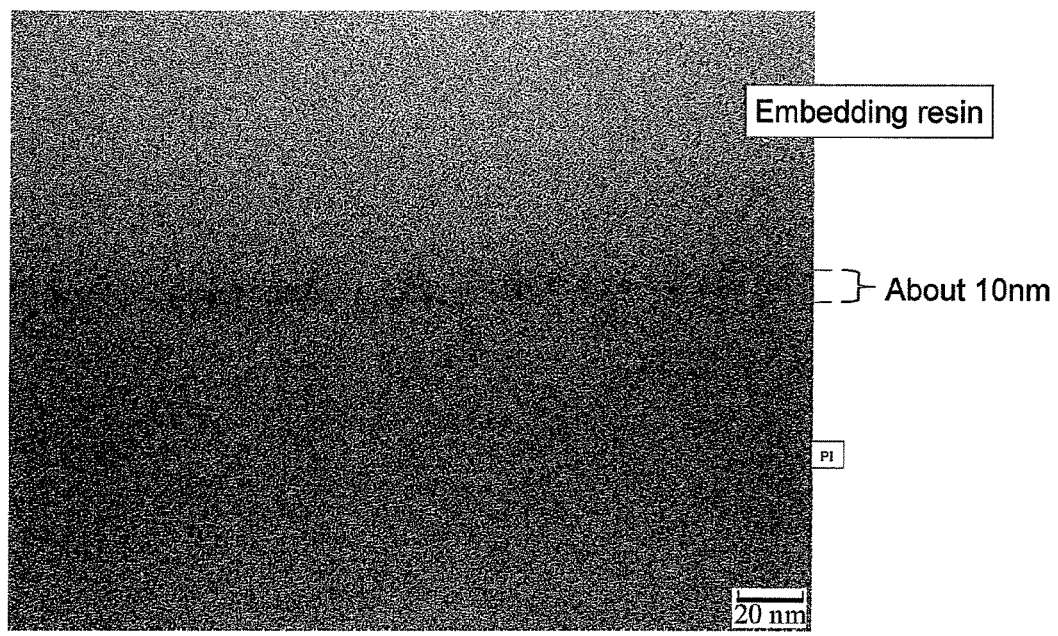
FIG. 6 shows a cross sectional TEM photograph obtained with a microtome.

Here, part of the resulting polyimide film was fixed in resin and sliced by a microtome for observation by transmission electron microscopy (TEM). The layer B in which palladium ions were reduced and distributed in the form of metallic palladium was present in a thickness of about 10 nm. A photograph is shown in FIG. 6.

Plating was then carried out for 5 min at a pH of 8.8 and a temperature of 35° C. using the electroless nickel phosphorous plating solution ENILEX NI-5 (by Ebara-Udylite Co., Ltd.) at 35° C., and a nickel-phosphorus film was precipitated to about 0.1 μm. This was followed by 1 minute of annealing at 110° C.

The nickel surface was then substituted with copper using PDC (by Ebara-Udylite Co., Ltd.). Finally, the copper sulfate plating solution CU-BRITE RF (by Ebara-Udylite Co., Ltd.) was used to carry out plating for 17 minutes at 25° C. and 3 A/dm$^2$, and a copper film was precipitated to about 10 μm.

This was followed by 30 minutes of annealing at 110° C.
The layers were rinsed with water between each step.
The resulting laminated polyimide substrate underwent cross sectional TEM with a microtome for observation of cross sections. A cross section is schematically shown in FIG. 1(*f*).

A description is provided based on FIG. 1(*f*). It was confirmed that, in the alkali-treated layer C, (i) a layer B, wherein nickel was precipitated and palladium ions had been reduced and distributed in the form of metallic palladium, was present in a thickness of about 10 nm at the border with the nickel-containing metal layer D, and (ii) a layer A, wherein no metallic palladium was present and unreduced palladium complex was distributed, was present in a film thickness of about 10 nm adjacent to the polyimide film side of the layer B.

Figure 5:
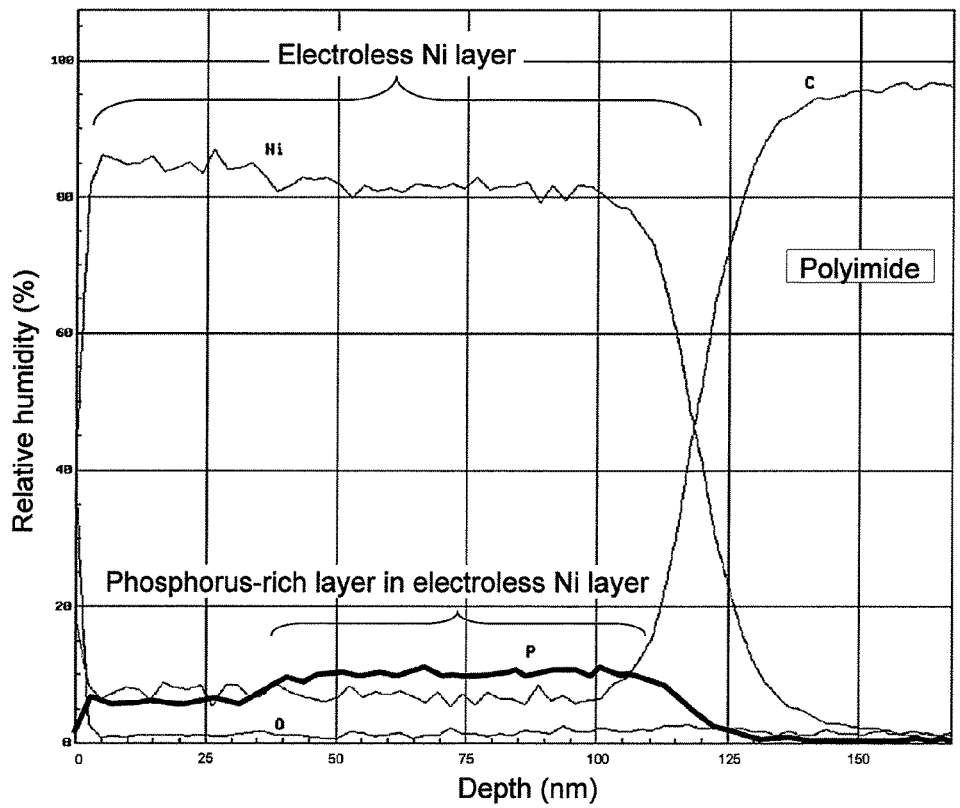
FIG. 5 illustrates the elemental distribution of a nickel phosphorous layer as determined by Auger analysis.

After the annealing treatment described above, Auger electron spectroscopy was carried out using a JAMP-7800 by JEOL before the nickel surface was substituted with copper. As a result, an electroless plated metal layer D (about 120 nm) having a graded increase in nickel precipitation from layer B was confirmed on the polyimide film F surface. Additionally, a phosphorus-rich layer (about 75 nm) was confirmed, as shown in FIG. 5, near the border with the A layer in the D layer. The "depth" on the horizontal axis in FIG. 5 means the depth from the surface between 12 and 13 in FIG. 1(*f*) (that is, the surface between the D layer and E layer).

A metal layer E composed of copper was formed by electrolytic plating on the metal layer D.

Analysis of the distribution of the palladium (Pd) component by X-ray electron spectroscopy (XPS: AXIS-His by KRATOS) in the depthwise direction from the polyimide surface at the point in time when the two-minute reduction step was completed confirmed the metal Pd layer and the polyimide (PI)+unreduced Pd joined layer to each be about 10 nm.

No metallic Pd was found in completely unreduced status, and it was confirmed that metallic Pd increased in accordance with the progress of the reduction.

Figure 3:
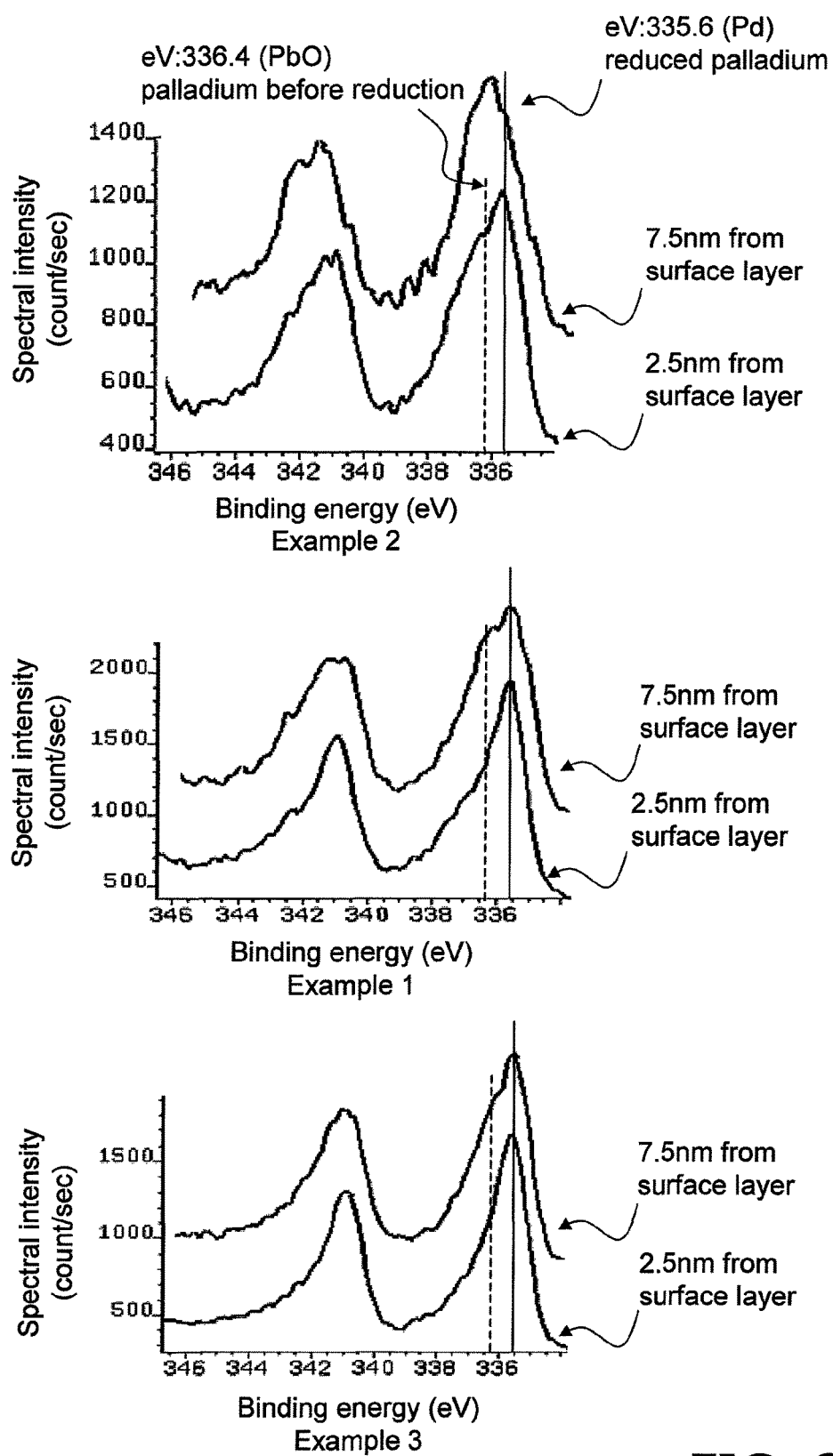
FIG. 3 is a graph showing the results of XPS analysis.

FIG. 3 shows the results of XPS analysis. As is evident from this, reduced palladium and unreduced palladium were detected at a depth of 7.5 nm from the surface of the initial polyimide film, and the amounts were about the same.

Furthermore, the peel strength between the resulting metal layer and polyimide film was confirmed by etching the metal layer to a width of 3 mm, and by measuring the strength when the metal layer was peeled off at a pulling speed of 50 mm/min and a pulling angle of 90° using a tensile strength tester (such as Test Stand Model-1310DW and Force Analyzer Explorer II (both by Aikoh Engineering Co., Ltd.)) in accordance with JIS C 6471 8.1.

Figure 2:
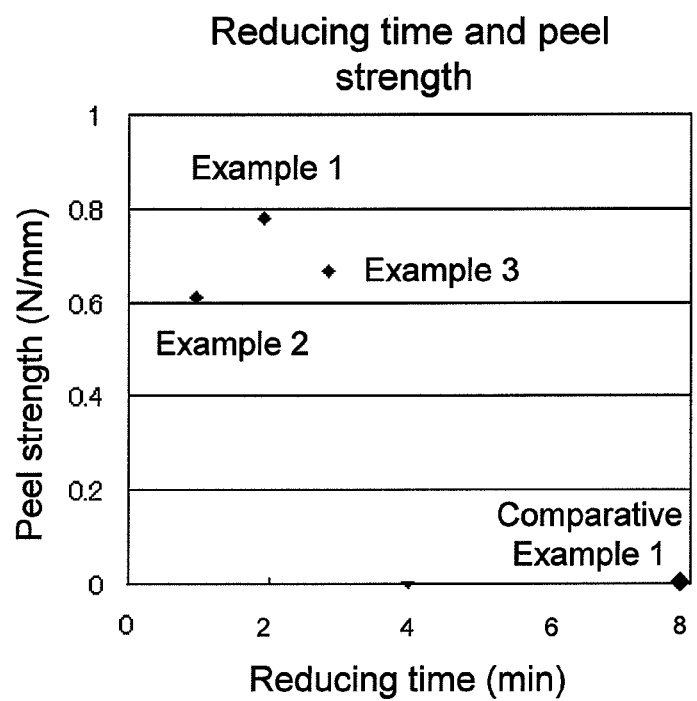
FIG. 2 is a graph showing the peel strength of the laminated polyimide substrate of the present invention.

As a result, the peel strength was confirmed to be an extremely high level of about 0.78 N/mm, as shown in FIG. 2.

In addition, similar measurement of the peel strength after 168 hours of exposure in a 150° C. environment revealed a strength of 0.48 N/mm.

The resulting laminated polyimide substrate was also made into a comb-shaped printed board with a line/space=75 μm/75 μm pattern by wet etching using a ferric chloride solution, and a insulation resistance test was conducted. The conditions at this time involved exposure to a temperature of 85° C. and a humidity of 85% as DC 25 V was applied across the two electrodes of the comb-shaped printed board, and changes in the insulation resistance were checked up to 1000 hours and the presence/absence of migration was checked by stereomicroscopy (SZX12: Olympus) at a maximum magnification of 90 times.

Figure 4:
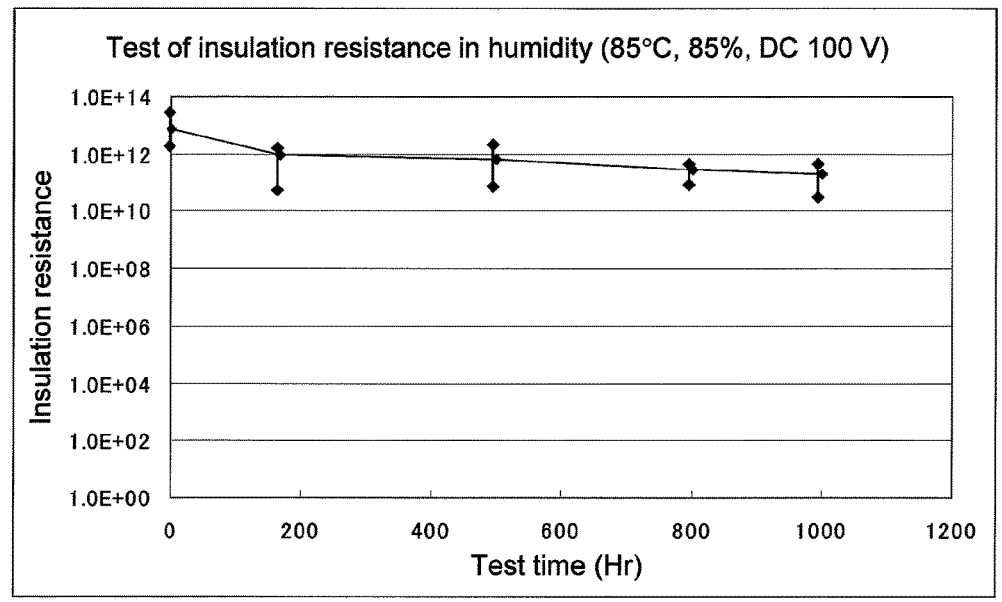
FIG. 4 is a graph showing the insulation resistance of the laminated polyimide substrate of the present invention.

The resulting laminated polyimide substrate was also made into a comb-shaped printing board with a line/space=30 μm/30 μm pattern by wet etching using a ferric chloride solution, a solder resist (SN-9000 by Hitachi Chemical Co., Ltd.) was applied by screen printing to 13 μm±2 μm on the pattern, and a insulation resistance test was conducted using 2 samples each in the MD and TD directions, for a total of four samples. The conditions at this time involved exposure to a temperature of 85° C. and a humidity of 85% as DC 100 V was applied across the two electrodes of the comb-shaped printed board, and changes in the insulation resistance were checked up to 1000 hours and the presence/absence of migration was checked by stereomicroscopy (SZX12: Olympus) at a maximum magnification of 90 times. As a result, $1\times10^{10}\Omega$ or less could be ensured throughout the entire period. FIG. 4 shows the results obtained with the line/space=30 μm/30 μm pattern. No migration was found.

To determine the insulation resistance, the above-mentioned comb-shaped printed board was removed from the environment described above and then allowed to stand for at least 1 hour at ambient temperature, and the insulation resistance was then measured with the application of DC 100 V using a insulation resistance gauge (SM8220 (Toa DKK)).

EXAMPLE 2

This example was produced and assessed in substantially the same as in Example 1 except that the immersion time in the reducing treatment solution at 35° C. was about 1 min, resulting in the formation of a layer in which layer B, wherein nickel was precipitated and palladium ions had been reduced and distributed in the form of metallic palladium, was present in a thickness of about 6 nm at the border with the nickel film, and a layer A, wherein no metallic palladium was present and unreduced palladium complex was distributed, was present in a film thickness of about 14 nm adjacent to the polyimide film side of the layer B.

The peel strength of this laminated polyimide substrate, as shown in FIG. 2, was 0.62 N/mm, and the peel strength similarly measured after 168 hours of exposure in a 150° C. environment was at least 0.4 N/mm.

The results were otherwise about the same as in Example 1.

As is also evident from the results of XPS in FIG. 3, virtually no reduced palladium was detected, whereas unreduced palladium was detected at a depth of 7.5 nm from the initial polyimide film surface.

EXAMPLE 3

This example was produced and assessed in substantially the same as in Example 1 except that the immersion time in the reducing treatment solution at 35° C. was about 4 min, resulting in the formation of a layer in which layer B, wherein nickel was precipitated and palladium ions had been reduced and distributed in the form of metallic palladium, was present in a thickness of about 15 nm at the border with the nickel film, and a layer A, wherein no metallic palladium was present and unreduced palladium complex was distributed, was present in a film thickness of about 5 nm adjacent to the polyimide film side of the layer B.

The peel strength of this laminated polyimide substrate, as shown in FIG. 2, was 0.66 N/mm, and the peel strength similarly measured after 168 hours of exposure in a 150° C. environment was at least 0.4 N/mm.

The results were otherwise about the same as in Example 1.

As is also evident from the results of XPS in FIG. 3, reduced palladium and unreduced palladium were detected at a depth of 7.5 nm from the initial polyimide film surface, but the amount of unreduced palladium was very low.

COMPARATIVE EXAMPLE 1

This example was produced and assessed in substantially the same manner as in Example 1, except that the immersion time in the reducing treatment solution at 35° C. was about 8 min, and a layer B in which nickel was precipitated and palladium ions had been reduced and distributed in the form of metallic palladium was arranged at about 20 nm at the border with the nickel film.

The peel strength of this laminated polyimide substrate was about 0 N/mm, as shown in FIG. 2. That is, in the region corresponding to layers A and B, the metallic palladium had fallen off the layer B due to excessive reducing treatment, this had resulted in poor nickel precipitation, and no electrolytic copper plating had precipitated in the parts where no nickel had precipitated. Parts where the peel strength could not be measured were therefore produced, and a uniform metal layer could not be formed on the surface of the polyimide substrate.

INDUSTRIAL APPLICABILITY

The laminated polyimide substrate of the present invention can be used in a wide range of applications in the field of the electronics industry. In particular, the invention is suitable as a flexible metal laminated board, such as an electromagnetic wave prevention film, in which patterns of fine pitch can be formed, in which various functions involving high dielectric properties, high frequency characteristics, and the like are required, and which are equipped with functions such as weatherability and corrosion resistance, and the metal film can be patterned by etching for various applications such as semiconductor chips, various electrical wiring boards, CSP, TCP, FPC, COF, TAB, antennae, multilayered wiring boards, and mother boards.

The invention claimed is:

1. A method for producing a laminated polyimide substrate, comprising:
    subjecting a surface of a polyimide layer to alkali treatment to form an alkali-treated layer containing an anionic functional group derived from the polyimide layer;
    subjecting the alkali-treated layer to a palladium catalyst-imparting treatment to introduce a complex of the palladium catalyst;
    subjecting the alkali-treated layer containing the complex of the palladium catalyst to a reducing treatment to form a laminated structure having a layer containing the palladium catalyst on a surface side of the alkali-treated layer and a layer containing the complex of the palladium catalyst on a polyimide layer side of the alkali-treated layer; and
    forming a metal layer on the surface of the polyimide layer, wherein the metal layer is a laminated structure having a layer formed by electroless nickel phosphorous plating and a layer formed by electrolytic plating, and wherein a peel strength between the metal layer and the polyimide layer is at least 0.35 N/mm before and after 168 hours of exposure in a 150° C. environment when a total thickness of the metal layer is greater than or equal to 8 μm and less than 18 μm,
    wherein the alkali-treated layer has a thickness of 40 nm or less,
    wherein during said subjecting of the alkali-treated layer to the reducing treatment, the layer containing the palladium catalyst and the layer containing the complex of the palladium catalyst are adjusted to a film thickness ratio of 1:7 to 7:1,
    wherein the layer containing the palladium catalyst and the layer containing the complex of the palladium catalyst each have a thickness of 1 to 15 nm, wherein the layer formed by electroless nickel phosphorous plating has a phosphorus-rich layer on the alkali-treated layer side and a non-phosphorus-rich layer on the surface side, and wherein the layer formed by electroless nickel phosphorous plating has ratio of phosphorus concentrations between the phosphorus-rich layer and the non-phosphorus-rich layer of 10:5 to 10:8, as determined by Auger electron microscopy, and wherein the layer formed by electroless nickel phosphorous plating has ratio of thickness between the phosphorus-rich layer and the non-phosphorus-rich layer of 1:9 to 9:1.

2. The method according to claim 1, wherein the reducing treatment is carried out using at least one kind of reducing agent selected from the group consisting of $NaBH_4$, $KBH_4$ hydrazine, dimethylamine borane, and trimethylamine borane.

3. The method according to claim 1, wherein during said subjecting of the alkali-treated layer to the reducing treatment, the layer containing the palladium catalyst and the layer containing the complex of the palladium catalyst are adjusted to a film thickness ratio of 1:4 to 4:1.

4. The method according to claim 1, wherein the alkali-treated layer has a thickness of 5 to 40 nm.

5. The method according to claim 1, wherein the peel strength between the metal layer and the polyimide layer is at least 0.40 N/mm before and after 168 hours of exposure in a 150° C. environment when a total thickness of the metal layer is greater than or equal to 8 μm and less than 18 μm.

6. The method according to claim 1, wherein the alkali-treated layer is present in a thickness of no more than 10% of a thickness of the polyimide layer.

7. The method according to claim 1, wherein the anionic functional group is a carboxyl group.

8. The method according to claim 1, wherein the polyimide layer has a thickness of about 1 μm to 100 μm.

9. The method according to claim 1, wherein the polyimide layer has a 10-point mean roughness of 100 nm or less measured in accordance with JIS B0601 (1994).

10. The method according to claim 1, wherein the alkali treatment comprises immersing the polyimide layer for about 10 seconds to 50 minutes in an alkali solution having a concentration of about 0.01 to 10 mol/L at a temperature ranging from about 20 to 100° C., thereby opening the imide rings of the polyimide layer by means of hydrolysis, and resulting in polyamic acid ions and carboxyl groups.

11. The method according to claim 1, wherein the complex of the palladium catalyst is Formula (I)

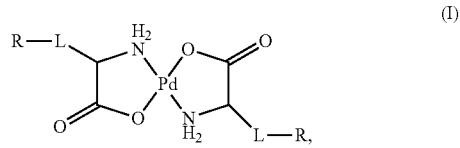

wherein L is an alkylene group, wherein R is an amino group or guanidyl group, and wherein the complex of the palladium catalyst is a trans isomer, which is shown in Formula (I), or a cis isomer of Formula (I), or mixtures thereof.

12. The method according to claim 11, wherein the alkylene group in Formula (I) has 1 to 20 carbon atoms.

13. The method according to claim 1, wherein the palladium catalyst-imparting treatment is carried out at a temperature in the range of about 20 to 100° C. for about 1 second to 10 hours, and allows cationic groups in the complex of the palladium catalyst to interact with anionic functional groups in the alkali-treated layer of the polyimide layer so that the complex of the palladium catalyst is introduced into the alkali-treated layer.

14. The method according to claim 1, wherein the reducing treatment is carried out by immersing the alkali-treated layer in a solution containing a reducing agent, or by spraying or applying the solution.

15. The method according to claim 1, further comprising at least one treatment selected from the group consisting of physical roughening treatment, surface degreasing treatment, solvent washing or water washing, corrosion resistance treatment, drying, and combinations thereof.

* * * * *